United States Patent
Sung

[11] Patent Number: 6,121,116
[45] Date of Patent: Sep. 19, 2000

[54] FLASH MEMORY DEVICE ISOLATION METHOD AND STRUCTURE

[75] Inventor: Kuo-Tung Sung, Hsinchu, Taiwan

[73] Assignee: Mosel Vitelic, Inc., Hsinchu, Taiwan

[21] Appl. No.: 09/041,834

[22] Filed: Mar. 12, 1998

[30] Foreign Application Priority Data

Mar. 3, 1998 [TW]  Taiwan ................................. 87103028

[51] Int. Cl.[7] ................................................. H01L 21/76
[52] U.S. Cl. ........................ 438/452; 438/297; 438/439; 438/257
[58] Field of Search ................................. 438/452, 451, 438/297, 439, 257

[56] References Cited

U.S. PATENT DOCUMENTS

| Re. 35,094 | 11/1995 | Wu et al. ................................. | 437/43 |
|---|---|---|---|
| 4,574,465 | 3/1986 | Rao . | |
| 4,971,923 | 11/1990 | Nakanishi ............................. | 438/452 |
| 5,061,654 | 10/1991 | Shimizu et al. ...................... | 438/451 |
| 5,066,992 | 11/1991 | Wu et al. ............................... | 357/23.5 |
| 5,110,756 | 5/1992 | Gregor et al. ......................... | 438/452 |
| 5,128,274 | 7/1992 | Yabu et al. ............................ | 438/452 |
| 5,202,850 | 4/1993 | Jenq ...................................... | 365/185 |
| 5,278,087 | 1/1994 | Jenq ...................................... | 437/43 |
| 5,374,586 | 12/1994 | Huang et al. ......................... | 438/452 |
| 5,440,159 | 8/1995 | Larsen et al. ......................... | 257/318 |
| 5,493,534 | 2/1996 | Mok ...................................... | 365/226 |
| 5,587,951 | 12/1996 | Jazayeri et al. ...................... | 365/203 |
| 5,606,532 | 2/1997 | Lambrache et al. ................. | 365/238.5 |
| 5,680,346 | 10/1997 | Pathak et al. ........................ | 365/185.1 |

OTHER PUBLICATIONS

Stanley Wolf, Ph.D., *Silicon Processing for the VLSI ERA, Vol. II: Process Integration*, (1990), Lattice Press, pp. 634–635.

*Primary Examiner*—Trung Dang
*Attorney, Agent, or Firm*—Townsend and Townsend and Crew, LLP

[57] ABSTRACT

The present invention provides novel isolation regions (501, 215) in a flash memory integrated circuit device. The isolation regions (501, 215) are formed on a silicon substrate (201), which has a core memory region (e.g., flash memory cell region) and a high voltage region (e.g., high voltage MOS device region). A silicon dioxide layer (e.g., silicon dioxide, silicon oxynitride) (203) is defined overlying the substrate including both of the regions. A nitride mask layer (205) is formed overlying the silicon dioxide layer in the core memory region and the high voltage region. This nitride mask layer exposes (207) a first isolation region coupled to the high voltage region. The first isolation region includes a first isolation structure having a first thickness of silicon dioxide. A step of oxidizing an exposed second isolation region to form the second isolation structure (215) and simultaneously oxidizing the first isolation structure to a second thickness is included.

9 Claims, 6 Drawing Sheets

FLASH MEMORY DEVICE ISOLATION METHOD AND STRUCTURE

BACKGROUND OF THE INVENTION

The present invention relates to semiconductor integrated circuits and their manufacture. The invention is illustrated in an example with regard to the manufacture of a read only memory ("ROM") cell, and more particularly to the manufacture of a flash electrically-erasable programmable read only memory ("Flash EEPROM") cell, but it will be recognized that the invention has a wider range of applicability. Merely by way of example, the invention may be applied in the manufacture of other semiconductor devices such as mask ROMs, microcontrollers, microprocessors ("MICROs"), digital signal processors ("DSPs"), application specific integrated circuits, among others.

Read only memories (ROMs) and various methods of their manufacture are known in the art. In the fabrication of a ROM, particularly an EEPROM, it is often necessary to fabricate a storage cell that maintains data after the applied power is turned off, that is, a storage cell having almost permanent data characteristics. The storage cells are generally mass data storage files where each cell corresponds to the presence or absence of a stored charge on a "floating" gate of a storage cell transistor. Specifically, the storage cell includes at least two conducting layers, i.e., one conducting layer is the floating gate of the storage cell transistor, and the other conducting layer is the control gate for control of the cell operation. The floating gate is formed on a thin gate oxide formed on the substrate. The control gate is located above the floating gate, and the control gate and floating gate are isolated each other by a thin dielectric layer known as an "interpoly oxide", which may typically be composed of oxide/nitride/oxide ("ONO"). In some typical EEPROMs, data is programmed into the cells by applying a high voltage to the control gate to inject hot electrons (or tunnel electrons in some devices) into the floating gate. The process of programming data is often called coding. In coding, the charge is transferred from the silicon substrate through the thin gate oxide layer to the floating gate.

In EEPROMs, especially for flash EEPROMs, two different gate oxide thicknesses are required for optimized device performance. In such devices, it is generally critical to grow a high-quality, thin gate oxide (used as a tunneling oxide) in the storage cell and (used as a thin gate oxide) in some transistors in the periphery of the storage cell region in order to provide high driving capability for higher speed. Controlling the thickness of the thin gate oxide is crucial, especially since design rules for devices with gates are becoming increasingly smaller and require thinner gate oxides. Because high-voltage supplies are used, thicker gate oxides at the periphery of the storage cell region are needed to maintain device quality and reliability after long-term high voltage stress from the high voltages (e.g., up to or greater than ±12V) generated through a pumping circuit for the storage cell coding and/or erase. Therefore, implementing different field oxide thicknesses in EEPROM devices is an important aspect of the fabrication of high performance devices.

As merely an example, FIG. 1 is a cross-sectional view diagram 10 of isolation structures 15, 17 for a flash memory device made using a local oxidation of silicon (LOCOS) process. These isolation structures 15, 17 are generally made by forming a thickness of silicon dioxide 12 using an oxidation process, i.e., thermal treatment, overlying a silicon substrate 11. Each of the isolation structures include active device regions in between the isolation structures. A silicon nitride layer is commonly formed overlying the active cell regions to prevent growth of oxide in active regions during the oxidation process. The isolation structures include an isolation structure 13 for a flash cell region, e.g., active cell region. A high voltage active cell region is also required for high voltage devices, e.g, MOS devices. The high voltage active cell region is isolated by way of thick field isolation oxide region 15. The thick field isolation region is generally made by lengthening the time of oxidation to create the thicker isolation region 15.

Unfortunately, extending oxidation times lead to a problem commonly known as a "bird's beak." As merely an example, outside edges of field isolation structure 13 includes the bird's beak 17. The bird's beak limits the size or area of the active cell region, depending upon the amount the bird's beak encroaches into the active cell region. Additionally, a bird's beak from isolation structure 15 can extend to a bird's beak from isolation structure 21. Isolation structure 15 is adjacent to isolation structure 21. This forms a relatively thick region of silicon dioxide 19, which cannot be effectively used to form active devices thereon. To reduce the detrimental influence of the bird's beak, a width between isolation structures also can be increased. Increasing the width also increases the size of the active cell region, thereby increasing the overall size of the die. Increasing die size is generally an undesirable consequence of poor designs in the fabrication of integrated circuits.

From the above, it is seen that a technique for an improved integrated circuit device is highly desirable.

SUMMARY OF THE INVENTION

The present invention provides a technique, including a method and a device, for manufacturing an integrated circuit device. In an exemplary embodiment, the present invention provides a technique for isolating adjacent cells, or devices, in an integrated circuit such as a flash memory device.

In a specific embodiment, the present invention provides a novel method for forming isolation regions in a flash memory integrated circuit device. This method includes a step of providing a silicon substrate, which has a core memory region (e.g., flash memory cell region) and a high voltage region (e.g., high voltage MOS device region). A silicon dioxide layer (e.g., silicon dioxide, silicon oxynitride) is defined overlying the substrate including both of the regions. A nitride mask layer is formed overlying the silicon dioxide layer in the core memory region and the high voltage region. This nitride mask layer exposes a first isolation region coupled to the high voltage region. A step of oxidizing the first isolation region through the exposed region of the nitride mask forms a first isolation structure having a first thickness of silicon dioxide. The nitride mask layer is patterned to expose a second isolation region coupled to the core memory region. A step of simultaneously oxidizing the exposed second isolation region forms a second isolation structure, and oxidizing the first isolation structure to a second thickness is included. The step of simultaneously oxidizing forms the second thickness of the first isolation structure that is greater than the first thickness. The second thickness of isolation material provides an isolation structure for the high voltage region.

In an alternative embodiment, the present invention provides a flash memory device having novel isolation regions. The flash memory device includes, among other elements, a silicon substrate, which has a core memory region (e.g., flash memory cell region), and a high voltage region (e.g., high voltage MOS device region). An oxide layer such as silicon dioxide or silicon oxynitride is defined overlying these regions on the substrate. A nitride mask layer is defined overlying the silicon dioxide layer in the core memory region and the high voltage region. The nitride mask layer exposes a first isolation region coupled to the high voltage region. The first isolation region has a first isolation structure having a first thickness to be converted into a second thickness, during for example, an oxidation process. The second thickness is greater than the first thickness. The nitride mask layer exposes a second isolation region coupled to the core memory region. The second isolation region forms a second isolation structure of a third thickness, which is less than the second thickness.

Numerous advantages are achieved using the present invention over conventional isolation techniques. In one or more embodiments, the present invention provides a novel nitride oxidation mask for creating a first isolation region of a first thickness and a second isolation structure of a second thickness, which is greater than the first thickness. The novel nitride oxidation mask is easy to make and use in defining the present oxidation structures. Additionally, the present invention provides a novel method for forming the isolation structures using multiple oxidation steps. These oxidation steps use conventional oxidation techniques, e.g., steam or wet oxidation. These and other advantages or benefits are described throughout the present specification.

These and other embodiments of the present invention, as well as its advantages and features are described in more detail in conjunction with the text below and attached figures.

DESCRIPTION OF THE SPECIFIC EMBODIMENTS

The present invention provides a technique, including a method and a device, for manufacturing an integrated circuit device. In an exemplary embodiment, the present invention provides a technique for isolating adjacent cells, or devices, in an integrated circuit such as a flash memory device.

Figure 1:
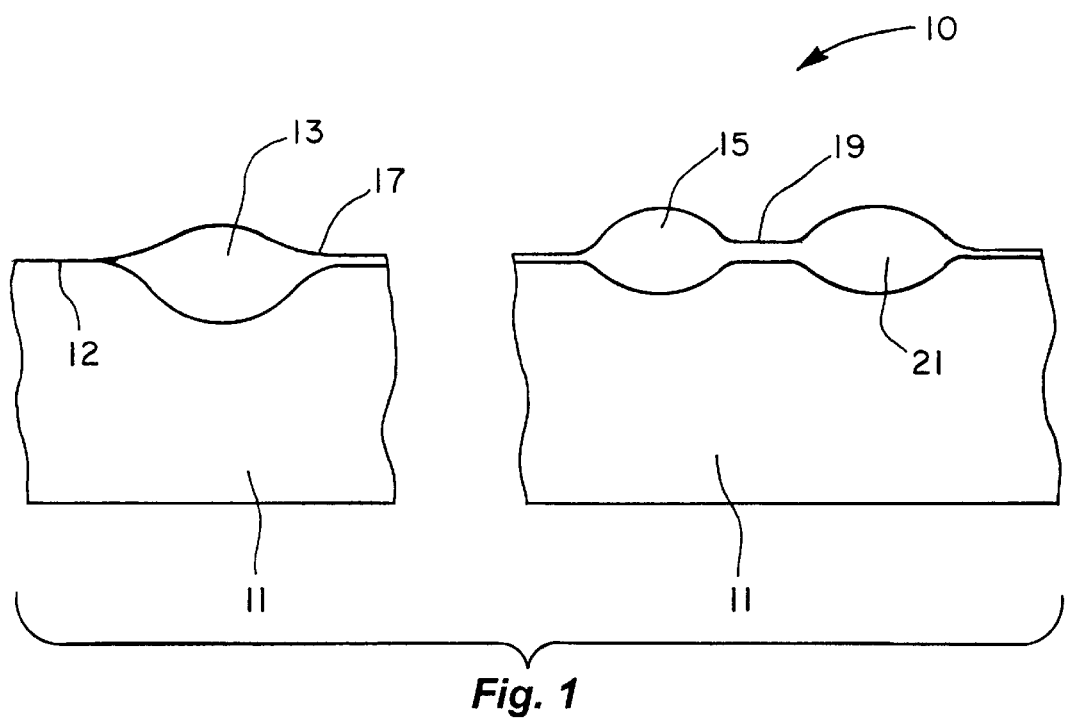
FIG. 1 is a cross-sectional view diagram of a conventional isolation structure.
Figure 2:
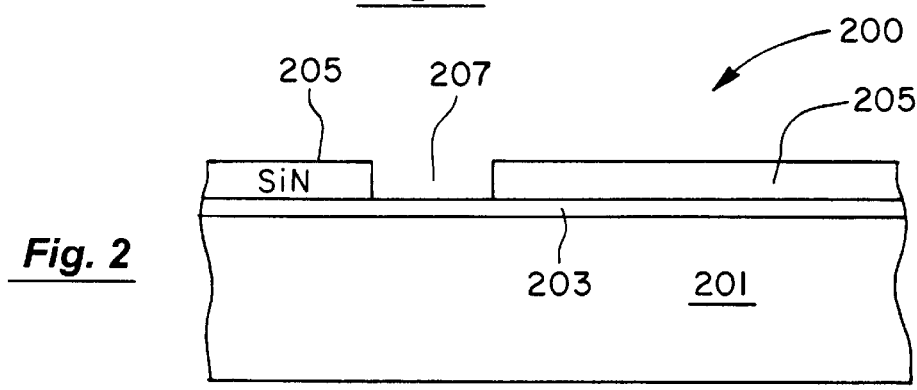
FIGS. 2–5 are simplified cross-sectional view diagrams of a method according to an embodiment of the present invention.

FIGS. 2–5 are simplified cross-sectional view diagrams of a method according to the present invention. These diagrams are merely examples and should not limit the scope of the claims herein. One of ordinary skill in the art would recognize other alternatives, variations, and modifications. The method begins by providing a substrate, such as silicon substrate 201, which is shown in FIG. 2. The substrate is often lightly doped with a P-type impurity such as boron or the like. Alternatively, a multilayered substrate such as silicon-on-insulator can be used.

A thin layer 203 of oxide is formed overlying the top surface of substrate 201. The thin layer of oxide is often high quality and substantially pinhole free. In most embodiments, the thin layer of oxide is defined using a thermal treatment or "steam" oxidation process. In some FLASH devices, the layer of oxide often ranges in thickness from about 50 Angstroms to about 300 Angstroms, but can also be others. A masking layer 205 is formed overlying the top surface of the thin layer of oxide. In a specific embodiment, the masking layer 205 is made of silicon nitride, which can be deposited using a variety of techniques. As merely an example, the silicon nitride is made using a thermal treatment process. Alternatively, the silicon nitride is deposited using a chemical vapor deposition (CVD) technique, which is commonly a plasma deposition technique, but can be others. For some FLASH devices, the thickness of silicon nitride ranges from about Angstroms to about 500 Angstroms, but can also be others. Of course, the exact thickness depends upon the application.

A masking layer (not shown) is defined overlying the silicon nitride layer to form an exposed region 207 for the isolation. The masking layer is made using conventional photolithography techniques. These techniques generally include spin coating, exposing, developing, and others. An etching technique is used to define the opening for the exposed region 207. The etching technique can include either wet etching or plasma etching. Plasma etching may be preferred in some applications. The etching technique is often selective between silicon dioxide layer 203 and silicon nitride layer 205. Mask layer is stripped using conventional techniques.

Figure 3:
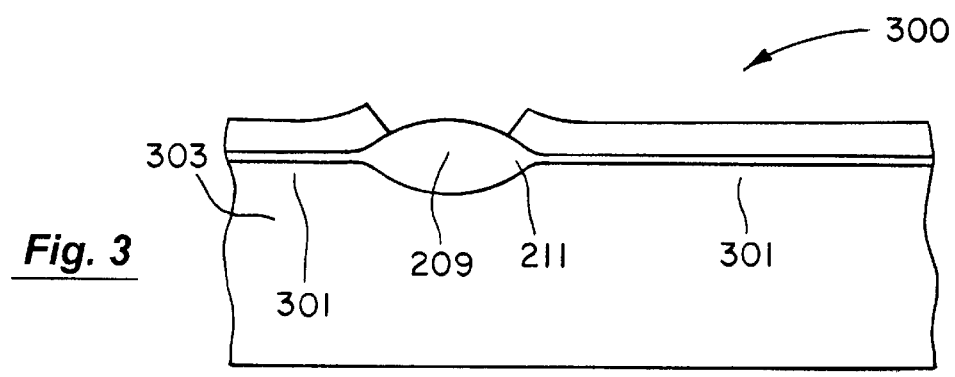

The exposed region 207 corresponds to an isolation region to be formed. A step of annealing forms isolation region 209, which is illustrated in FIG. 3. Thermal annealing the structure in FIG. 2, for example, forms the resulting structure 300 of FIG. 3. The nitride mask substantially prevents oxidation of underlying regions 301 of the oxide layer. Exposed region 207, which is exposed to an oxidizing environment, grows into isolation region 209, which is adjacent to a high voltage active device region 303. In most embodiments, the oxidizing environment has a temperature ranging from about 850 degrees Celsius to about 1050 degrees Celsius. Gases such as $O_2$ and $H_2O$ are used to form isolation region 207. Isolation region 207 has a center region that is much thicker than outer or peripheral region 211.

Figure 4:
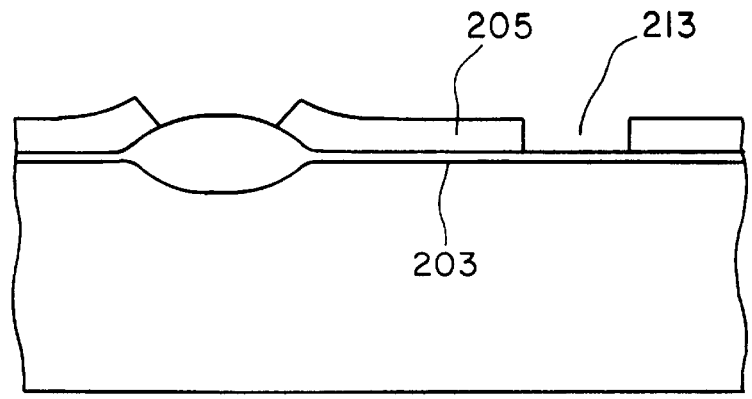

A mask layer is applied overlying the top surface of the structure of FIG. 3. The masking layer is made using conventional photolithography techniques. These techniques generally include spin coating, exposing, developing, and others. An etching technique is used to define the opening for an exposed region 213, which is shown in FIG. 4. The etching technique can include either wet etching or plasma etching. Plasma etching may be preferred in some applications. The etching technique is often selective between silicon dioxide layer 203 and silicon nitride layer 205. Mask layer is stripped using conventional techniques.

Figure 5:
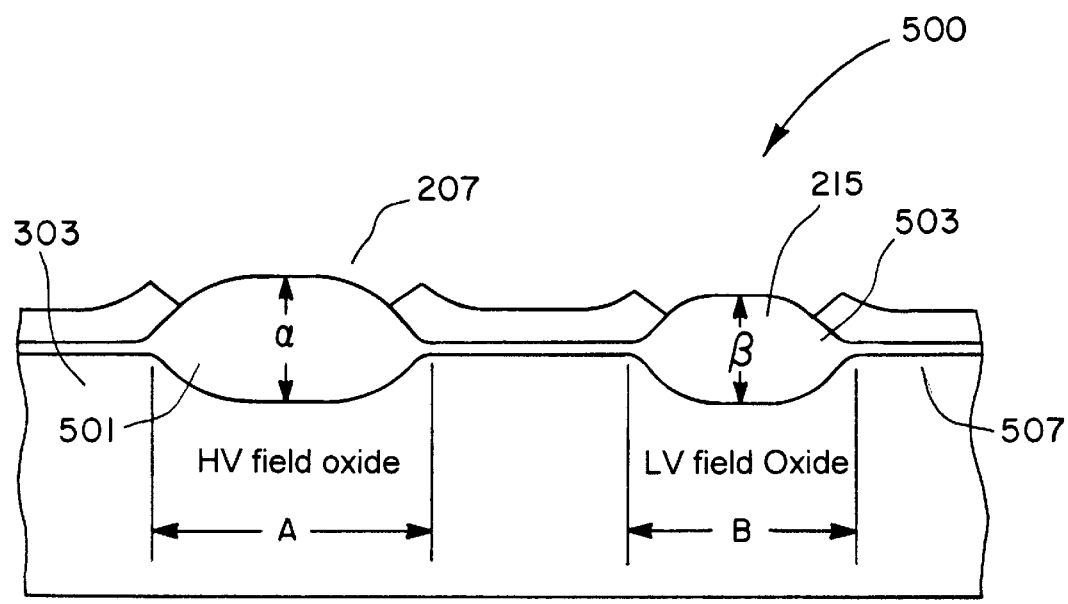

The exposed region 213 corresponds to an isolation region to be formed. A step of annealing forms isolation region 215, which is illustrated in FIG. 5. Thermal annealing the structure in FIG. 4, for example, forms the resulting structure 500 of FIG. 5. The nitride mask substantially prevents oxidation of underlying regions 301 of the oxide layer. Exposed regions 207, 213, which are exposed to an oxidizing environment, grow into isolation regions 501, 215. Isolation region 501 is adjacent to a high voltage active device region 303. Isolation region 215 is adjacent to a lower voltage or core memory region 507. In most embodiments, the oxidizing environment has a temperature ranging from about 850 degrees Celsius to about 1050 degrees Celsius. Gases such as $O_2$ and $H_2O$ are used to form isolation regions 501, 215. Isolation region 215 has a center region that is much thicker than outer or peripheral region 503.

These sequence of steps are used to form two isolation regions of different thicknesses. The isolation regions are used to separate, for example, a high voltage region from a low voltage region. The high voltage region is for a high voltage which exceeds a switching voltage for the low voltage (memory) region. The ratio between this high voltage and the switching voltage ranges from greater than about 1.5, or greater than about 2, or greater than about 3, or greater than about 4.5, or greater than about 6, in embodiments of the present invention, but is not limited to these values.

Isolation region 501 is much thicker than isolation region 215. Accordingly, it is desirable to use isolation region 501 to isolate a high voltage region from other circuit elements such as a memory cell region. Isolation region 501 has a thickness ($\alpha$) that can range from about 3000 Angstroms to about 8000 Angstroms for a transistor dimension design of about 1.0 micron and larger. Isolation region 215 has a thickness ($\beta$) that can range from about 1000 Angstroms to about 3000 Angstroms for a transistor dimension design of about 1.0 micron and less. A ratio between the two thicknesses ($\alpha/\beta$) ranges from values greater than about 1.5, or greater than about 2, or greater than about 3, or greater than about 4.5, or greater than about 6, in specific embodiments of the invention, but is not limited to these values.

Figure 6:
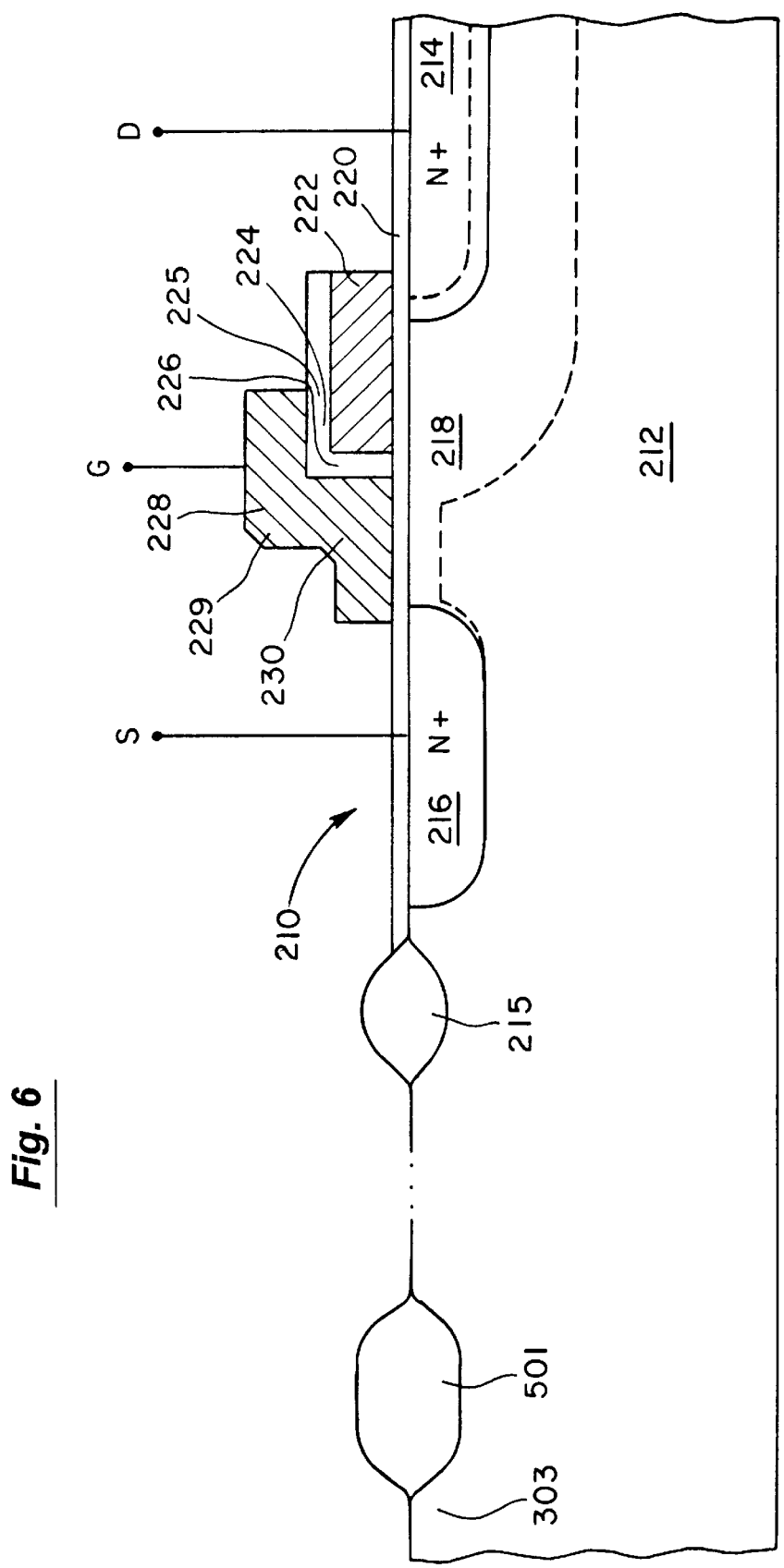
FIGS. 6–10 are simplified schematic diagrams of flash memory device structures according to embodiments of the present invention.

FIGS. 6–11 illustrate examples of flash memory devices according to embodiments of the present invention. In particular, FIG. 6 illustrates an example of a flash memory device according to an embodiment of the present invention. These and other flash memory devices can be formed in the active region or core memory cell region of the integrated circuit device. Referring to FIG. 6, for example, there is shown a single transistor non-volatile electrically alterable semiconductor memory cell 210. The cell 210 comprises a semiconductor substrate 212, such as silicon. The substrate 212, in one embodiment, can be a P-type silicon substrate with a typical doping level range from 5 to 50 ohm-cm, depending on the level of scaling.

Within the substrate 212 are defined a source region 216 and a drain region 214 with a channel region 218 therebetween. Disposed over the source region 216, channel region 218, and drain region 214 is a first layer 220 of insulating material, on the order of 70–200 angstrom of thickness, but can be other thicknesses. Disposed over the first layer 220 is a floating gate 222. The floating gate 222 is positioned over a portion of the channel region 218 and over a portion of the drain region 214. The floating gate 222 can be a polysilicon gate and in one embodiment is a re-crystallized polysilicon gate.

A second insulating layer 225 has a first portion 224 disposed over the floating gate 222 and a second portion 226 disposed adjacent to the floating gate 222. The first portion 224 (top wall 224) of the second layer 225 is an insulating material and can be silicon dioxide, silicon nitride or silicon oxynitride and is on the order of 200–1500 Angstroms in thickness. The second portion 226 (side wall 226) of the second layer 225 is also of an insulating material and can be silicon dioxide, silicon nitride or silicon oxynitride and is on the order of 200–500 Angstroms in thickness. A control gate 229 has two portions: A first portion 228 is disposed over the top wall 224 of the second layer 225; a second portion 230 is disposed over the first layer 220 and is immediately adjacent to the side wall 226 of the second layer 225. The second portion 230 of the control gate 229 extends over a portion of the source region 216 and over a portion of the channel region 218.

An isolation region 215 separates isolates FLASH cell from another region of the substrate. A second isolation 501, which is thicker than the isolation region 215, separates a high voltage active region 303 from another region of the substrate. The isolation regions 215 and 501 are made according to the process described above with respect to earlier figures.

The dimensions of the cell 210 depend upon the process used. Thus, the foregoing dimensions for the first layer 220, side wall 226, and top wall 224 are only illustrative examples. Further, the material, for the first layer 220 and the second layer 225 are also illustrative examples only. In general, however, the dimensions of the cell 210 can be such that electrons emanating from the source region 216 are injected onto the floating gate 222 by sensing an abrupt potential drop. Further, the dimensions of cell 210 must be such that charges from the floating gate 222 are removed by tunneling through the Fowler-Nordheim mechanism through the second layer 225 onto the control gate 229. The particular manner of operating the cell 210 is as follows:

Initially, when it is desired to erase cell 210, a ground potential is applied to the drain 214 and to the source 216. A high-positive voltage, on the order of +15 volts, is applied to the control gate 229. Charges an the floating gate 222 are induced through the Fowler-Nordheim tunneling mechanism to tunnel through the second layer 225 to the control gate 229, leaving the floating gate 222 positively charged.

When selective cells 210 are desired to be programmed, a ground potential is applied to the source region 216. A positive voltage level in the vicinity of the threshold voltage of the MOS structure defined by the control gate 229, (on the order of approximately of +1 volt), is applied to the control gate 229. A positive high voltage, on the order of +12 volts, is applied to the drain region 214. Electrons generated by the source region 216 will flow from the source region 216 towards the drain region 214 through a weakly-inverted channel region 218. When the electrons reach the region where the control gate 229 meets the side wall 226, the electrons see a steep potential drop approximately equal to the drain voltage, across the surface region defined by the gap of the side wall 226. The electrons will accelerate and become heated and some of them will be injected into and through the first insulating layer 220 onto the floating gate 222.

The injection of electrons onto the floating gate 222 will continue until the charged floating gate 222 can no longer sustain a high surface potential beneath, to generate hot electrons. At that point, the electrons or the negative charges in the floating gate 222 will "turn off" the electrons from flowing from the source region 216 onto the floating gate 222.

Finally, in a read cycle, ground potential is applied to the source region 216. Conventional transistor read voltage, such as +2 volts and +5 volts, are applied to the drain region 214 and to the control gate 229, respectively. If the floating gate 222 is positively charged (i.e., the floating gate is discharged), then the channel region 218 directly beneath the floating gate 222 is turned on. When the control gate 229 is raised to the read potential, the region of the channel region 218 directly beneath the second portion 230 is also turned on. Thus, the entire channel region will be turned on, causing electrical current to flow from the drain region 214 to the source region 216. This would be the "1" state.

On the other hand, if the floating gate 222 is negatively charged, the channel region 218 directly beneath the floating gate 222 is either weakly turned on or is entirely shut off. Even when the control gate 229 and the drain region 214 are raised to the read potential, little or no current will flow through the portion of the channel region directly beneath the floating gate 222. In this case, either the current is very small compared to that of the "1" state or there is no current at all. In this manner, the cell 210 is sensed to be programmed at the "0" state.

Figure 7:
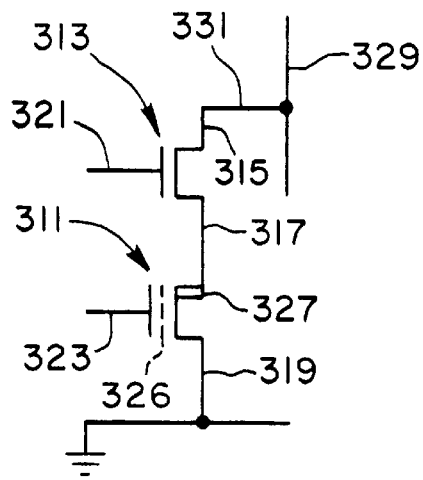

FIG. 7 is a schematic circuit diagram of a memory cell according to an embodiment of the present invention. With reference to FIG. 7, a memory cell of the present invention includes a memory device 311 and a field effect transistor 313 which allows selection of memory device 311 from among other memory cells. A drain 315 of selection transistor 313 is connected via a metal contact 331 to a read line 329. Selection transistor 313 and memory device 311 are connected together in series at a node 317 which serves as both a source for selection transistor 313 and a drain for memory device 311. A source 319 of memory device 311 connects to a common source line which in turn is coupled to ground. The gate 321 of selection transistor 313 is electrically connected to a word select line. The control gate 323 of memory device 311 is connected to a sense enable and program line. The circuit of FIG. 7 also includes in the memory device 311 a floating gate 326 separated from the substrate by only a thin oxide layer, as represented in FIG. 7 by a dashed line 326. A program and erase implant 327 is provided in memory device 311 proximate to the device 317. The thin oxide layer together with the program and erase implant 327 permit rapid erasure of the memory device 311 electrically in a few milliseconds, instead of the usual twenty minutes or so with UV light with the thicker oxide layer under the floating gate of prior memory devices. The implant 327 also enables more efficient reprogramming to occur. As will be seen below, the memory cell layout and fabrication process of the present invention provides for a smaller size memory cell.

Figure 8:
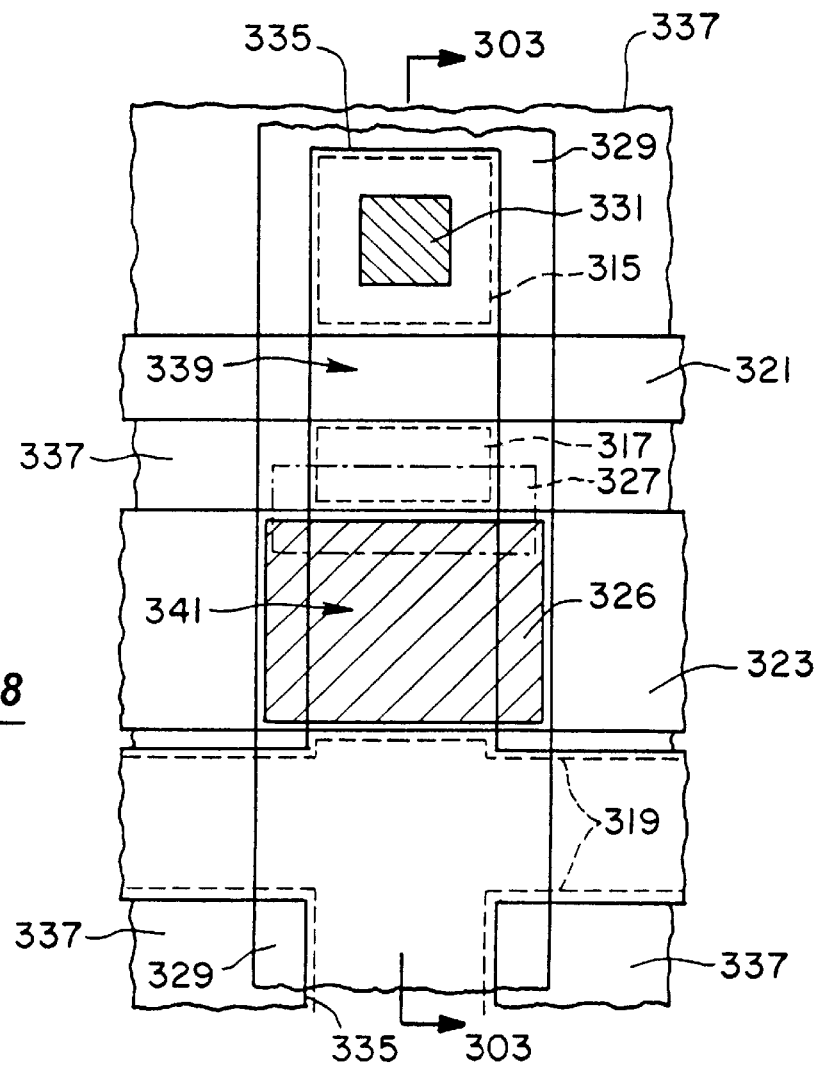
Figure 9:
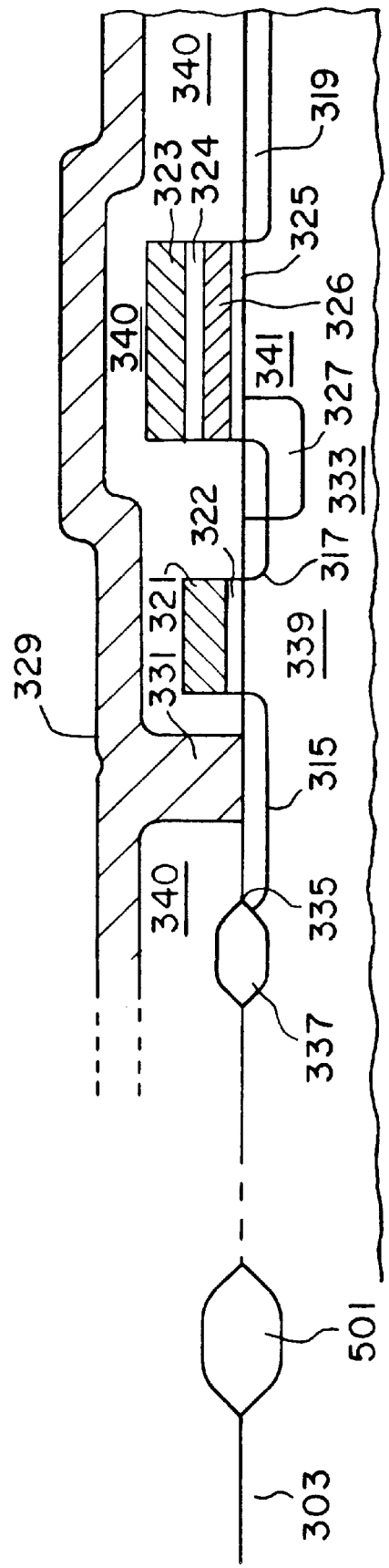

FIG. 8 is a top plan view of the memory cell of FIG. 7. FIG. 9 is a side sectional view taken along the line 303—303 in FIG. 8. With reference to FIGS. 8 and 9, a semiconductor chip having an array of memory cells comprises a semiconductor substrate 333 with active memory areas 335 therein. A field isolation oxide layer 337 is present over all nonactive areas outside of memory areas 335. Three spaced-apart implants 315, 317 and 319 are located in memory area 335 with channel areas 339 and 341 defined therebetween. Implant 315 forms a drain for the selection transistor 313 in the circuit of FIG. 7. Implant 317 forms a node functioning as both a source for selection transistor 313 and a drain for memory device 311 in FIG. 7. Implant 319 forms a source for memory device 311. While substrate 333 is typically P-type and implants 315, 317 and 319 are N-type.

A program and erase implant 327 is also present in the active memory area 335 of substrate 333. Implant 327 overlaps part of node implant 317, extending into channel 341 between implants 317 and 319 of the memory device 311. Implant 327 is N-type and may be formed by either phosphorus or arsenic ion implantation followed by diffusion, as explained below. A thin oxide layer 325 is disposed over channel 341 between implants 317 and 319, including over the portion of program and erase implant 327 which extends into channel 341, in active area 335. Typically, thin oxide layer 325 is between 70 Angstroms and 150 Angstroms thick. The remainder of active area 335 between field oxide layer 337 has an oxide layer 322 over it. Oxide layer 322 is thicker than thin oxide layer 325, typically about 300–500 Angstroms thick.

A polysilicon floating gate 326 is disposed on thin oxide layer 325 and extends over that portion of program and erase implant 327 that is beneath thin oxide layer 325. An interpoly oxide layer 324 is disposed on floating gate 326 and a polysilicon sense gate 323 is situated above interpoly oxide layer 324. A polysilicon select gate 321 is disposed above channel 337 between implants 315 and 317. The entire wafer is covered with an insulating glass layer 339 with vias for contacts 331 therein. A layer of conductive lines 329 is disposed on top of glass layer 340.

In addition to the field isolation layer 337, there is another field isolation layer 501 that is thicker than the layer 337. The isolation layer 501, isolates a high voltage active region 303. The isolation layer 501 is made, along with at least nearby portions of the isolation layer 337 according to the process described above with respect to earlier figures.

Figure 10:
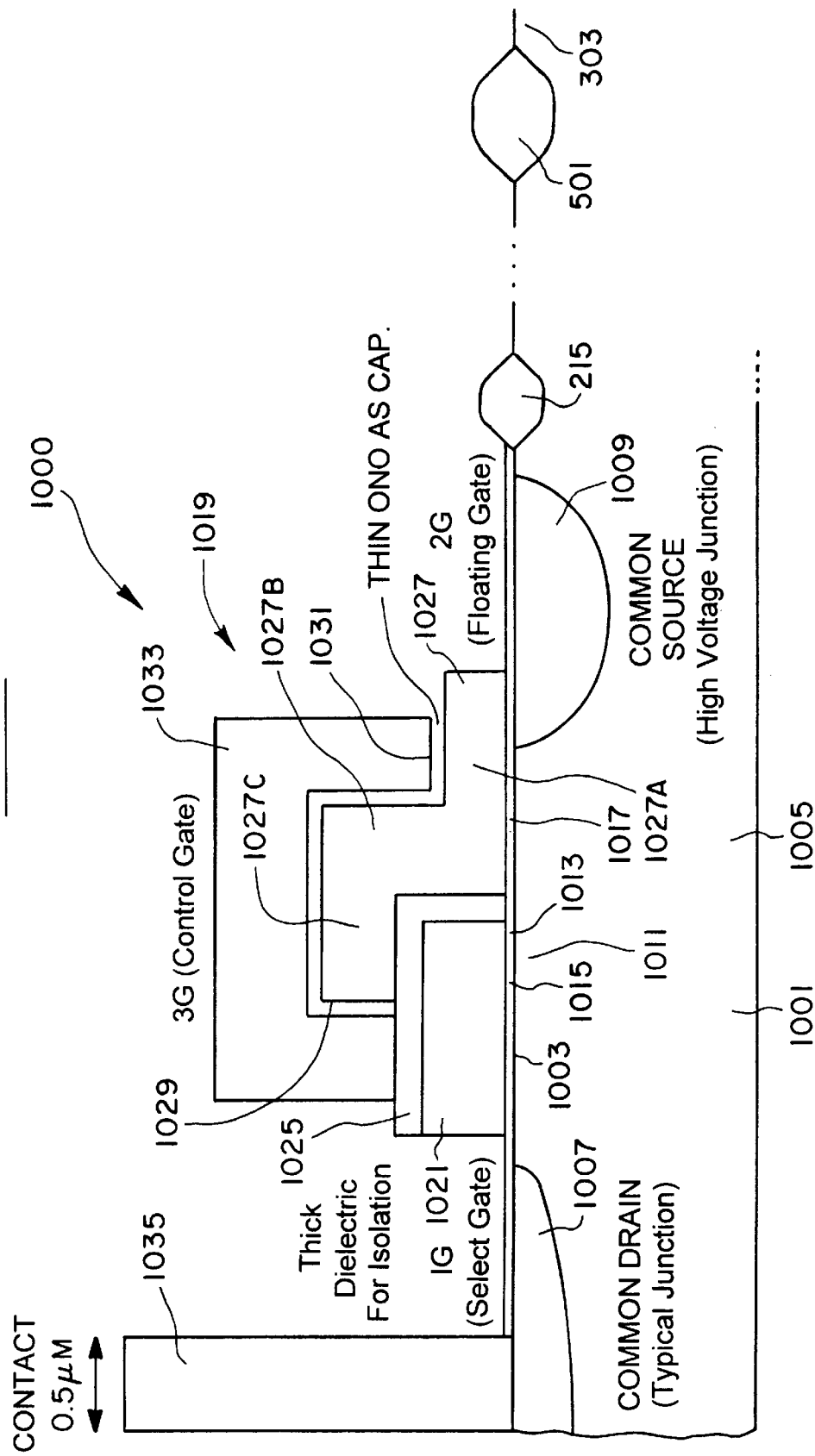

In a specific embodiment, the present invention also can be applied to an improved flash memory cell 1000, such as the one shown in the simplified diagram of the FIG. 10, for example. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a $POCl_3$ compound or the like. Alternatively, the gate can be in-situ doped using a phosphorous bearing compound or the like. In further embodiments, the polysilicon layer can be laid in an amorphous state, which is later crystallized. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g, control gate, floating gate. The select gate also has a channel region ranging from about 0.2 micron and less or about 1.0 micron and less, but is not limited to these ranges. Additionally, the select gate has a thickness of about 500 Angstroms and less and about 3500 Angstroms and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate.

The split gate 1019 also has an edge 1029 overlying a region on the top surface of the split gate. Split floating gate 1019 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a $POCl_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer depending upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a $POCl_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

An isolation region 215 separates isolates the FLASH cell 1000. A second isolation 501, which is thicker than the isolation region 215, isolates a high voltage active region 303. The voltage for the high voltage active region 303 is higher than the voltage for the cell 1000. The isolation regions 215 and 501 are made according to the process described above with respect to earlier figures.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

In a specific embodiment, the present memory cell can be programmed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiments described above are merely examples of flash memory devices. Integrated circuits can include one or more of these devices in a cell. Thousands, millions, billions, and even trillions of these devices are formed in a single integrated circuit chip. Thus, the integrated circuit chip can have 4 Meg., 16 Meg. 64 Meg. 256 Meg., 1 Gig. or more devices on a single sliver of silicon. The channel length of these devices range from about 0.4 micron to 0.25 micron and less. The flash memory device can be formed in a stand alone integrated circuit chip, commonly termed the FLASH memory chip, in some embodiments. Alternatively, the flash memory device can be integrated into a microprocessor, microcomputer, digital signal processor, application specific integrated circuit, and the like. Of course, the number of cells and design size depend highly upon the application.

While the above is a complete description of specific embodiments of the present invention, various modifications, variations, and alternatives may be employed. For example, the wafer could be a semiconductor-on-insulator type of wafer, or a wafer other than a silicon wafer. The present invention could be adapted to other types of wafers and materials with appropriate selection of materials and processes. These equivalents and alternatives are intended to be included within the scope of the present invention. Therefore, the scope of this invention should not be limited to the embodiments described, and should instead be defined by the following claims.

What is claimed is:

1. A method for forming isolation regions in a flash memory integrated circuit device, said method comprising:

providing a silicon substrate, said substrate comprising a core memory region and a high voltage region, said silicon substrate having a silicon dioxide layer thereon and said high voltage region comprising a high voltage device;

forming a nitride mask layer overlying said silicon dioxide layer in said core memory region and said high voltage region, said nitride mask layer exposing a first isolation region coupled to said high voltage region;

oxidizing said first isolation region to form a first isolation structure having a first thickness;

patterning said nitride mask layer to expose a second isolation region coupled to said core memory region; and oxidizing said exposed second isolation region to form a second isolation structure having a second thickness and simultaneously oxidizing said first isolation structure to a third thickness, said third thickness being greater than said first thickness wherein said high voltage region is for a high voltage, and said core memory cell region is for a switching voltage, wherein the high voltage is at least about fifty percent higher than the switching voltage.

2. The method of claim 1 wherein said silicon dioxide layer is a layer selected from thermal oxide or silicon oxynitride.

3. The method of claim 1 wherein said core memory region comprises a flash memory cell.

4. The method of claim 1 wherein said third thickness is at least twenty percent greater than said first thickness.

5. The method of claim 1 wherein said high voltage region is for a high voltage, and said core memory cell region is for a switching voltage, wherein the ratio between the high voltage and the switching voltage is greater than about three.

6. The method of claim 1 wherein said third thickness exceeds said second thickness by at least about two hundred percent.

7. A method for forming isolation regions in a flash memory integrated circuit device, said method comprising:

providing a silicon substrate, said substrate comprising a core memory region and a high voltage region, said silicon substrate having a silicon dioxide layer thereon;

forming a nitride mask layer overlying said silicon dioxide layer in said core memory region and said high voltage region, said nitride mask layer exposing a first isolation region coupled to said high voltage region;

oxidizing said first isolation region to form a first isolation structure having a first thickness;

patterning said nitride mask layer to expose a second isolation region coupled to said core memory region; and oxidizing said exposed second isolation region to form a second isolation structure having a second thickness and simultaneously oxidizing said first isolation structure to a third thickness, said third thickness being greater than said first thickness;

wherein said first and said second isolation regions are substantially free of boron.

8. The method of claim 7 wherein said high voltage region is for a high voltage, and said core memory cell region is for a switching voltage, wherein the ratio between the high voltage and the switching voltage is greater than about three.

9. The method of claim 7 wherein said third thickness exceeds said second thickness by at least about two hundred percent.

* * * * *